United States Patent [19]

Berry et al.

[11] 4,353,087

[45] Oct. 5, 1982

[54] AUTOMATIC MASK ALIGNMENT

[75] Inventors: Daniel G. Berry, Newtown; David A. Markle, Norwalk, both of Conn.

[73] Assignee: The Perkin-Elmer Corporation, Norwalk, Conn.

[21] Appl. No.: 19,964

[22] Filed: Mar. 12, 1979

[51] Int. Cl.³ .............................................. H04N 7/18
[52] U.S. Cl. .................................... 358/101; 356/138; 356/152
[58] Field of Search ............................. 358/101, 106; 250/237 R; 356/138, 152, 394, 397

[56] References Cited

U.S. PATENT DOCUMENTS

| 3,838,274 | 9/1974 | Doubek, Jr. et al. | 356/152 |
| 3,885,877 | 5/1975 | Horwath et al. | 356/152 |
| 4,070,117 | 1/1978 | Johannsmeier et al. | 356/138 |

Primary Examiner—Joseph A. Orsino, Jr.
Attorney, Agent, or Firm—S. A. Giarratana; E. T. Grimes; T. P. Murphy

[57] ABSTRACT

A target for use in aligning masks used in producing microcircuits which is of a size that can be printed on a microcircuit chip without interfering with the lines thereon, consisting only of lines vertically or diagonally disposed with respect to the image transducer is disclosed. Also disclosed is an automatic system for aligning such targets.

11 Claims, 10 Drawing Figures

LARGE TARGET APPROACH

SMALL TARGET APPROACH

WAFER

MASK

ALIGNED

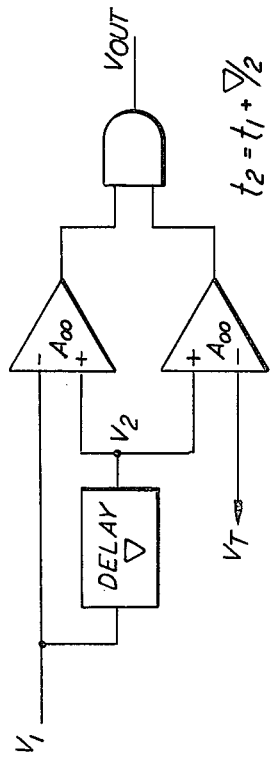
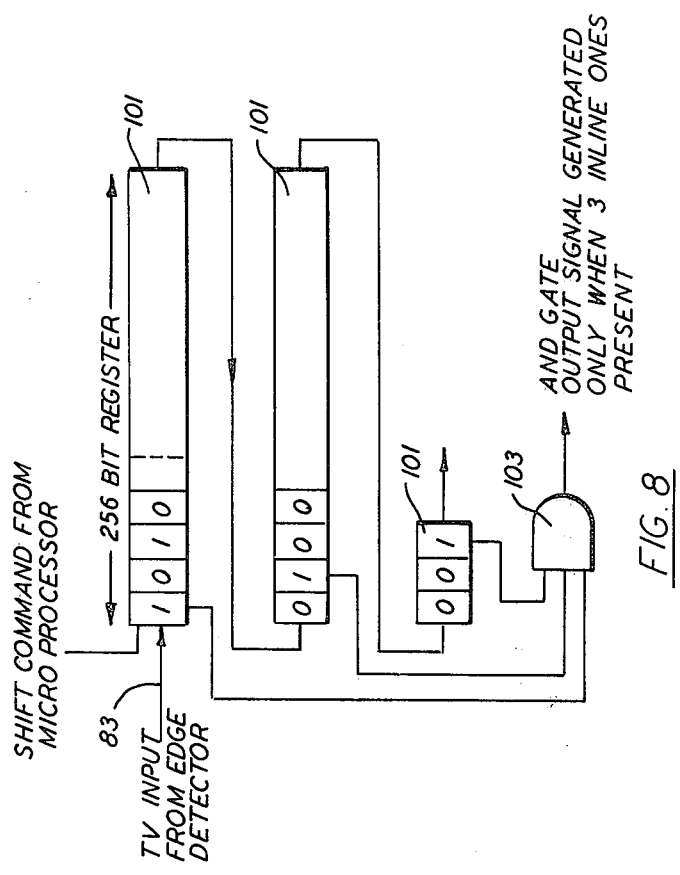
$t_2 = t_1 + \frac{D}{2}$
FIG. 7
FIG. 8
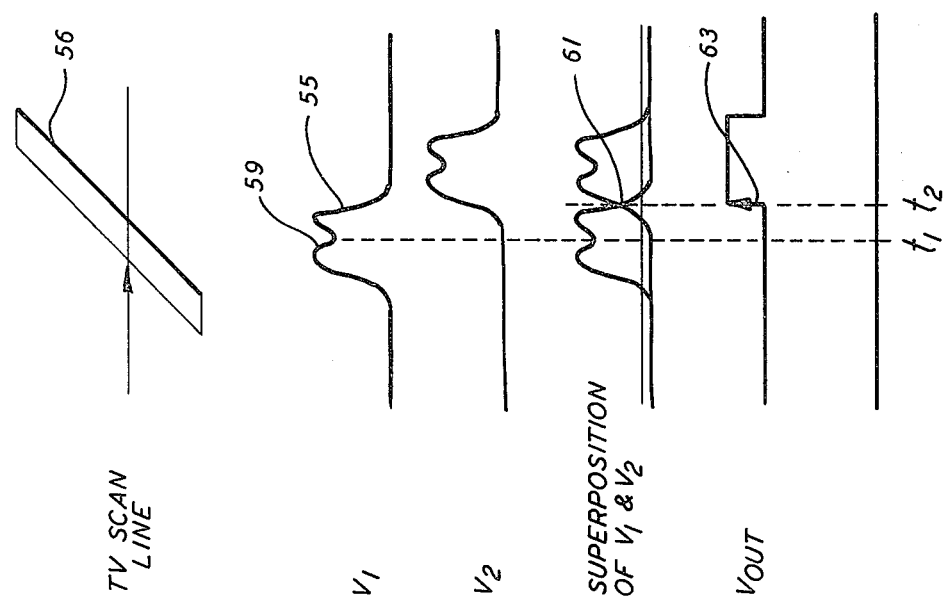
FIG. 6

AUTOMATIC MASK ALIGNMENT

BACKGROUND OF THE INVENTION

This invention relates to the processing of microcircuits in general and more particularly to an automatic mask alignment system for use in apparatus in which an image on a mask is projected on to a substrate coated with a resist in order to expose the resist for further processing of the substrate.

In the making of micro-circuits the general process followed is that of generating an oxide film on the semiconductor substrate; coating the oxide film with a photoresist and then illuminating the photoresist through a mask to expose selected portions of the resist. After exposure, the photoresist is developed creating a pattern corresponding to either the exposed or unexposed portions depending on the type of photoresist. The remaining photoresist forms a protective cover for the oxide layer which is then etched, for example, in hydrofluoric acid, to expose the layer below the oxide film, whereupon impurities can be infused into the substrate for doping purposes to form transistors and the like. Once this is done, the process may be repeated numerous times with additional oxide films formed, more resist deposited, the resist exposed, developed, and the oxide film etched with further steps of doping or depositing carried out.

The exposure of the photoresist is carried out by using masks which are prepared for that purpose. Separate masks are used for each of the successive steps. If everything is to appear in the proper place on the micro-circuit a high degree of alignment is necessary between steps.

Typically, the substrate which is exposed, is in the form of a wafer which will contain thereon a plurality of identical chips or micro-circuits. The mask, similarly will contain numerous identical patterns, one for each of the chips. The mask is made by taking the pattern to be imaged on each one of the micro-circuits and forming it numerous times following a step and repeat process. Thus, the same pattern is found across the rows and columns of the mask.

One system which is used in carrying out exposure of wafers in this manner is disclosed in detail in U.S. Pat. Nos. 3,975,364; 4,011,011; 4,006,645; for example. The system disclosed therein is one which utilizes manual alignment, with the operator viewing the mask and wafer through an optical system. The system includes a fine alignment system and coarse alignment system along with the projection system. The actual element for alignment is carried out by the device disclosed in U.S. Pat. No. 4,006,645.

Proper alignment requires the ability to align at least two targets, one on each side of a wafer. This is accomplished with the viewing system of the type illustrated on FIG. 4 of U.S. Pat. No. 4,011,011 in which the viewing field contains two images derived from the wafer and mask. This then requires that alignment targets be printed on the mask for this purpose.

The first mask imaged on the wafer does not require alignment since there is no previous pattern on which to align. For subsequent automatic alignment, it is necessary to print targets on at least two sites on the water. After processing is carried out, these targets are present and then are used in the next processing step to accurately align the wafer with the next masks. When alignment is done manually, the nature of the targets is not particularly critical; however, if this alignment is to be carried out automatically, certain problems arise. In automatic alignment, it has generally been the practice to make large targets, i.e., targets which take up the space of two or more micro-circuits. This requires that during the step-and-repeat process of making the mask, the microcircuit pattern be interrupted in at least two places so as to include the large alignment target patterns. Since the relative position of the circuit and alignment patterns can change from one mask to another, alignment of the alignment patterns can lead to misalignment of the circuit patterns. Furthermore, at least two spaces which would normally yield microcircuits are lost to the target.

Thus the need for an improved automatic alignment system which avoids these difficulties becomes evident.

SUMMARY OF THE INVENTION

The present invention provides a solution to this problem. In its broadest aspect, the present invention comprises utilizing a small target, i.e., a target of such a size that it can be printed on a single micro-circuit chip itself without interfering with the normal lines thereon. In order that the target can be reliably detected, the target consists only of diagonal lines at 45° to the chip edges. Since the lines made on the micro-circuit for processing purposes are normally horizontal and vertical, the target is thus distinguishable from the normal micro-circuit photography. In its simplest form, the target is a diamond. Alignment is carried out by initially exposing a larger diamond on the microcircuit and centering it around a small diamond contained on the next mask. It is sometimes preferred that the new wafer targets be printed each time there is an exposure. This will avoid the loss of resolution which can occur as additional layers of silicon oxide are formed over the targets and will also prevent confusion caused by the mask target exposed after the previous alignment. Furthermore, although the target may be a solid or filled-in diamond, a hollow target is preferable. Furthermore, it is preferred that the diamond not be complete but that each of the diamonds forming the mask target and the wafer target have missing sections in order to permit easier identification. Though the use of such a target, various detection schemes are possible.

A further aspect of the present invention comprises a method and apparatus for accurately detecting these patterns on the wafer.

Although it is only necessary that the targets be present on two sites of the wafer, it is preferred, in order not to have changed images in the step and repeat camera, that the target be printed on each chip. The target being there does no harm even if it is not used. Alternatively, the targets, rather than being somewhere inside the chip, can be in the sections of the wafer between chips. Normally these areas are masked out but it is no problem to include the targets therein. Such is possible only by using the small target of the present invention.

In broad terms, the system for detecting the presence of targets includes a TV camera using a very sensitive vidicon, a circuit which detects the presence of a target line in the video signal, a digitizer which digitizes those locations, i.e., digitizes the x and y locations thereof, and includes am memory buffer, and a micro-computer system which receives the digitized data and from this data locates diagonal lines, determines the end points of the diagonal lines, reconstructs the diamond and there-from determines alignment. If alignment is not within preset tolerances, the micro-computer system provides outputs to the alignment motor drive, the alignment drive being as described in the aforementioned U.S. Pat. No. 4,006,645.

Also disclosed is a digital preprocessor to aid in filtering out data which is not associated with diagonal lines.

BRIEF DESCRIPTION OF THE DRAWINGS

FIG. 6 is a diagram illustrating the principle of position detecting used in the present invention.

FIG. 7 is a diagram of a circuit for detecting line position.

FIG. 8 is a block diagram of a preprocessor unit using digital shift registers.

DETAILED DESCRIPTION OF THE INVENTION

Figure 1:
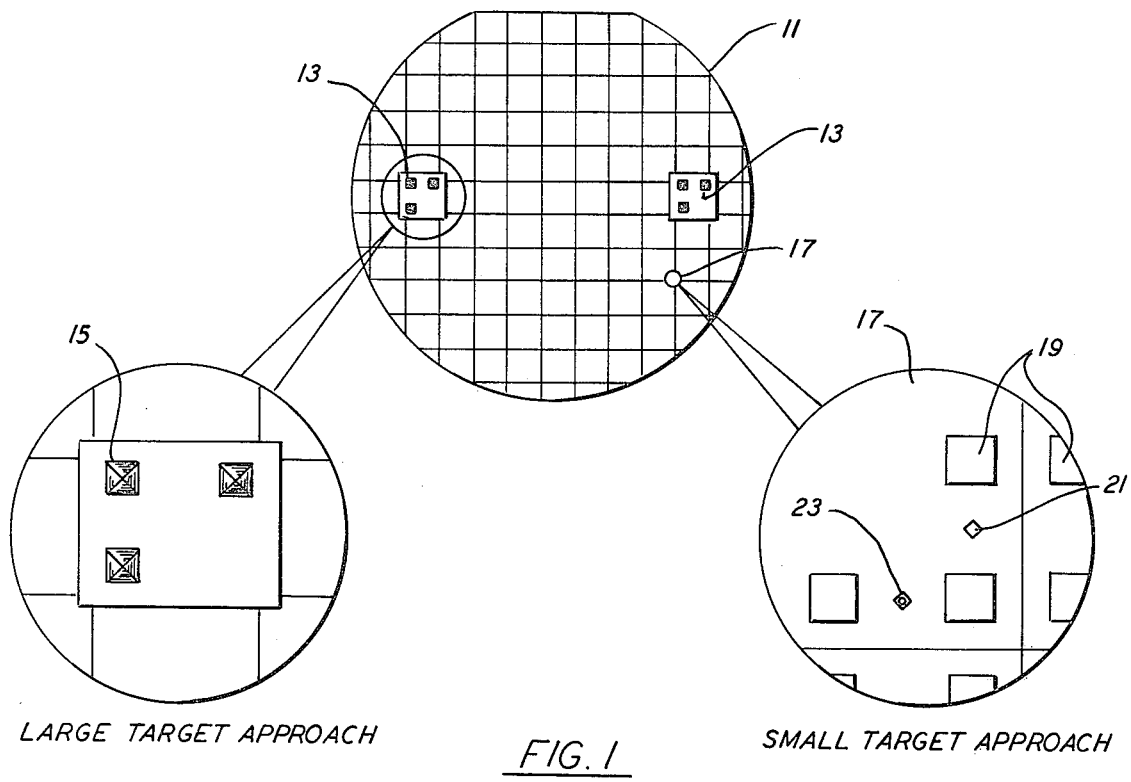
FIG. 1 is a view comparing the large scale target of the prior art with the small scale target of the present invention.

As previously indicated, the essential feature of the present invention lies in the use of a small target and in the use of a target which is diamond shaped. This is best illustrated by FIG. 1 which is a comparison of the small and large target approaches. A wafer 11 is shown broken down into a plurality of squares, each square representing a micro-circuit. As indicated previously, there is a need for a target on at least two sites on the wafer. Thus, there are shown conventional target arrays 13 on each side of the wafer 11. The target array 13 on the left hand side of the wafer is shown in an enlarged presentation. Note that the target array 13 consists of a rectangular block containing three separate targets 15 and that each array displaces one integrated circuit on the wafer. In accordance with the present invention, however, small targets are used. Such a small target is shown within the enlarged view of the circuit 17. Note that a much smaller area of the wafer 11 is circled and includes parts of four micro-circuits. Visible on the micro-circuit are typical bonding pads 19 which are typically 5 mils square. Shown is an unused alignment target 21 and an alignment target 23 which has been previously used. Note that the alignment targets are printed on each of the sections or micro-circuits 25 on the wafer. Thus they are between other components on the wafer and do not require the displacement of a pair of integrated circuits therefore resulting in a greater yield.

Figure 2:
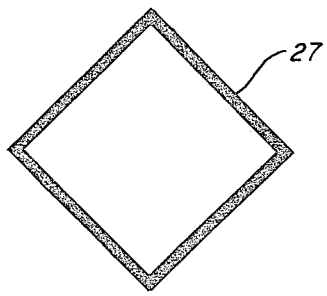
FIG. 2 is a view of a first embodiment of the alignment target of the present invention.
Figure 2:
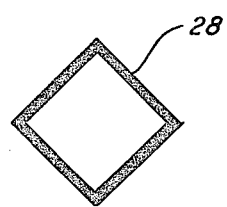
Figure 2:
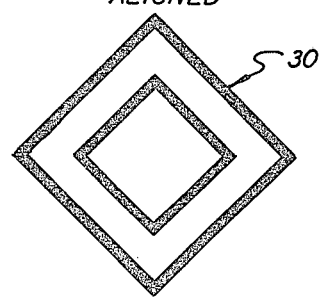

FIG. 2 illustrates a first embodiment of the alignment pattern of the present invention. Each time a pattern for processing is printed on the wafer for each microcircuit, an alignment pattern 27 is also printed. On the next succeeding mask, an alignment pattern 28 is provided of the same diamond shape and in the corresponding position as the pattern 27, but of smaller size. When the two are aligned, they take the relative position shown by the overall diagram 30. The mask may, of course, in addition to containing a smaller pattern 28, contain somewhere else one or more copies of pattern 31 which will be available for the next steps in the process.

Figure 3:
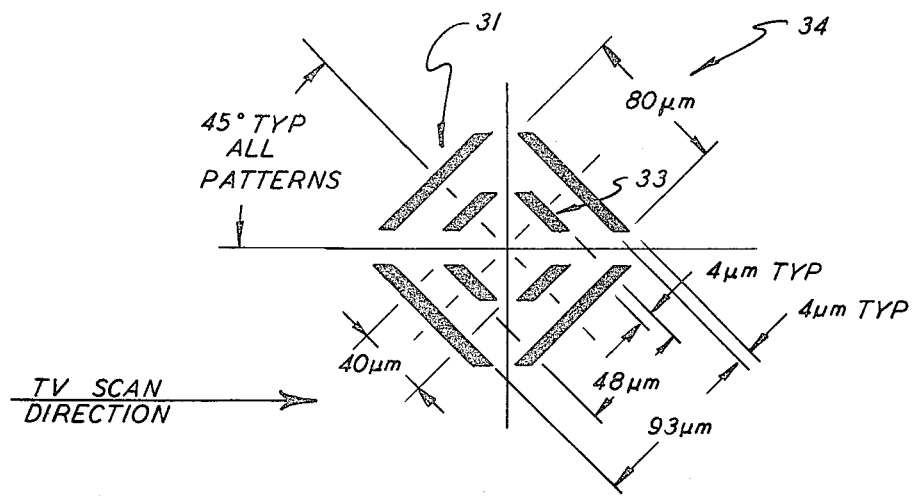
FIG. 3 is a view of a second embodiment of a pattern according to the present invention.

Although the closed diamonds of FIG. 2 may be used, it is preferred that the patterns shown on FIG. 3 be used. In these patterns, the diamond 27 is replaced by a pattern which has a diamond outline but in which the corners are cut away. Thus, on each of the sides of the diamond there only remains a segment 31. Similarly, with the small diamond only the segments 33 remain so that the resulting pattern 34 is as shown on the figure when alignment takes place. The dimensions of the targets 31 and 33 can be varied to suit the resolution of the imaging system and the field of the viewing system and might typically be as given on FIG. 3. Furthermore, although the pattern shown on FIGS. 2 ane 3 are hollow patterns which have certain advantages, it is possible to use solid patterns.

Figure 4:
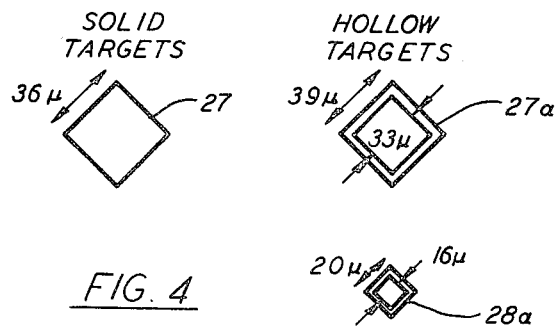
FIG. 4 is a view of a hollow pattern according to the present invention.

FIG. 4 illustrates both target types.

As noted, it is through the use of such patterns that automatic alignment is possible and thus, in its broadest aspects the present invention comprises the use of such patterns for alignment. However, another aspect of the invention is the manner in which these patterns are used to carry out automatic alignment. This will now be explained.

Figure 5:
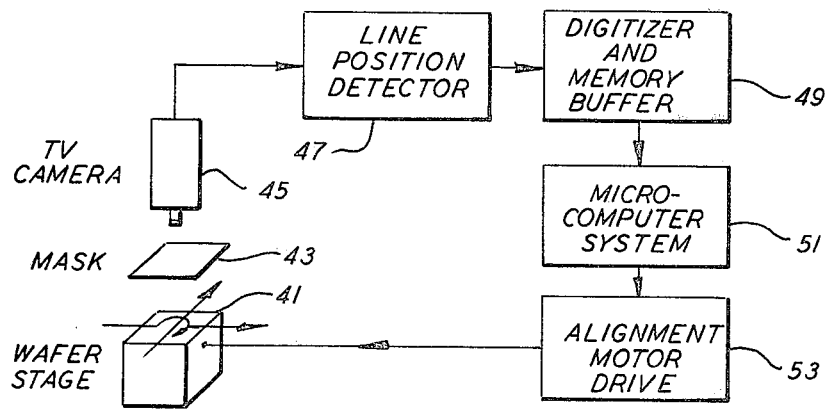
FIG. 5 is a basic block diagram of a system for detecting the patterns of FIGS. 2 and 3.

FIG. 5 shows the basic block diagram of the system of the present invention. In conventional fashion the wafer is disposed on a stage 41. Though the optical system of the aforementioned patent, the wafer 41 and mask 43 can both be observed. A television camera is installed to view two portions of the mask and wafer through a split field optical system using dark field illumination. Viewing the targets under dark field illumination results in edges providing consistent bright images on a dark background due to the topography inherent in IC fabrication. This type of illumination also allows for efficient use of a technique known as video integration to increase the video signal to noise ratio. Video integration is implemented by blanking the electron readout beam in the vidicon image tube for a desired number of frames allowing the TV image in the form of a photocathode charge or conductivity difference to build up with time resulting in an increased video signal when the vidicon target is first allowed to be sampled.

Initial mechanical positioning is carried out by the wafer loading mechanism to bring the mask and wafer into general alignment. The television camera scans over the portions of the mask and wafer in the viewing field and provides its video output to a line position detector 47 during one frame. The detector, in a manner to be more fully described below, detects the presence of the lines on the alignment patterns. Upon detection, these positions are digitized and temporarily stored in a memory buffer 49 and then in a microcomputer memory. The digitized information is then available to a microcomputer 51 in which computations are carried out in order to determine whether or not the mask pattern is aligned with the wafer pattern. Depending on the degree of misalignment, outputs are provided to an alignment motor drive 53 which drives the wafer stage, in the manner described in the aforementioned U.S. Pat. No. 4,006,645.

The line position 47 detector, as the television camera scans horizontally will detect not only diagonal edges of the pattern but will tend to also detect any vertical lines.

The principle on which it operates is illustrated by FIG. 6. The video signal 55 from a typical hollow target line 56 illuminated by dark field illumination has a characteristic voltage versus time wave shape 59 as shown in FIG. 6 as VI. Detection is carried out as follows:

1. A second signal V2 is derived from V1 by delaying it for a time ΔT.
2. The crossover point 61 when V2 becomes greater than V1, is used to generate a signal (V out) which causes the contents of a counter to be stored in memory.
3. The output signal (Vout) is qualified by requiring that the signal V2 be above a threshold voltage $V_T$ (i.e., noise level).

The resulting positive going edge of the $V_{out}$ pulse 63 will be generated at a time delayed by a constant amount after the center of the waveform is encountered. This constant delay is equal to one half of the total delay line time Δt. The optimum time delay Δt varies for different target line-widths but small variations in line sizes or edge profiles can be readily accommodated by a fixed time delay. FIG. 7 shows a schematic diagram of the line position detector.

Figure 10:
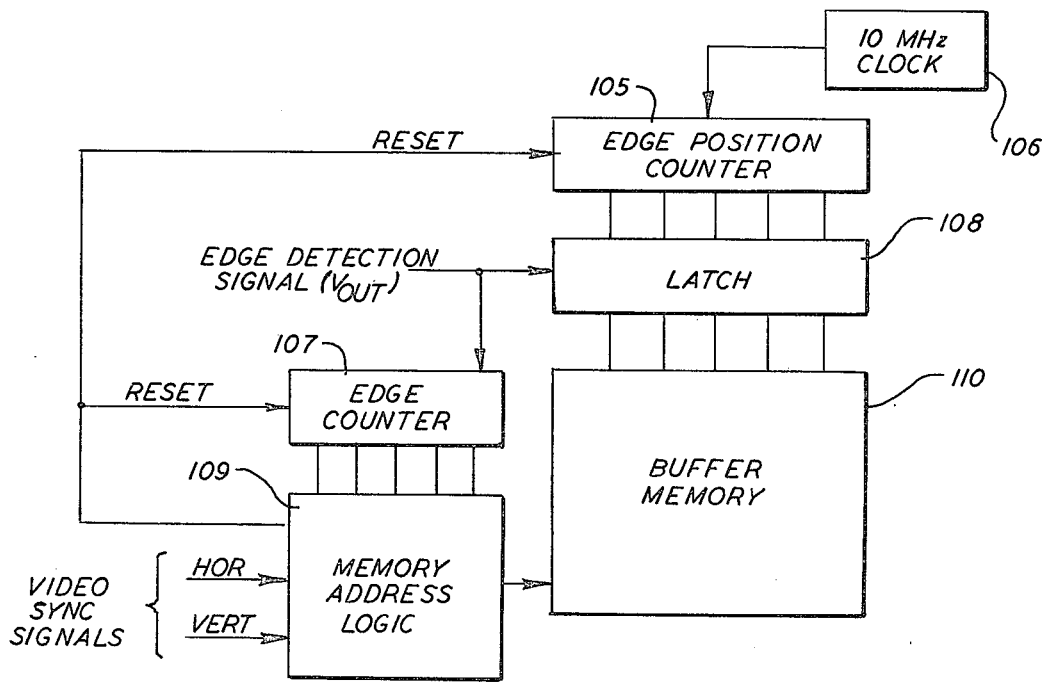
FIG. 10 is a schematic diagram of a digitizer and memory buffer.

FIG. 10 shows a way in which the edge position signal Vout is converted to a number corresponding to its horizontal position which may be stored in the microcomputer memory. Digitization of the horizontal position of a line or edge is accomplished by starting a counter at the beginning of each horizontal scan line and incrementing it at a 10 MHZ rate. When an edge is detected, its position is stored in the microcomputer memory as an eight bit word corresponding to the count when the edge was detected. The 10 MHZ counting rate permits each horizontal TV line to be divided into 2 acquisition zones each having 256 possible line positions. Each line has 16 words of computer memory reserved allowing as many as 15 edge positions, and a zero word designating end of valid data. If one uses 170 lines in each acquisition zone, a total of 16 by 170 or 2720 words of memory are required for each acquisition zone.

At the end of the digitizing, there will be stored in a memory associated with the micro-computer the locations of each of the edge crossings. The magnitude of the word in memory represents the horizontal position coordinate; and the memory location indicates the vertical position coordinate.

Attached hereto is a computer program for the microprocessor needed to carry out the identification of targets and a positioning of the wafer stage to bring the targets into alignment.

Basically, the computer program does the following:

1. Searches through the raw data stored in the memory looking for diagonal lines. All diagonal lines having three or more consecutive points are listed.
2. The endpoints and y-intercepts of each diagonal line are computed.
3. Close-by, like slope diagonal lines are combined; thus reducing the number of endpoints and y intercepts.
4. The known mask target size is used to predict y-intercept spacing for mask targets. Y-intercept spacings from like-slope line pairs corresponding to the mask spacing are listed and a mid-point calculated for each pair. If more than one line pair is found for each slope, the lines with the largest number of data points are used.
5. From the midpoints of oppositely sloping diagonal pairs, the center of the mask target is computed.
6. The same procedure is used to find the wafer target center and the mask and wafer target separation is calculated.
7. The information from the other side of the split field viewing system is used to find its mask and wafer target separation in the same fashion.
8. The separations from both viewing sites are used to compute the worst alignment error.
9. If the error is greater than the predetermined limit, e.g., 1.0 μm, an output is provided to drive the wafer stage to correct the misalignment and the procedures to put another alignment picture into memory and compute the alignment error are repeated. If the error is under the limit, the exposure is allowed to take place.

Figure 9:
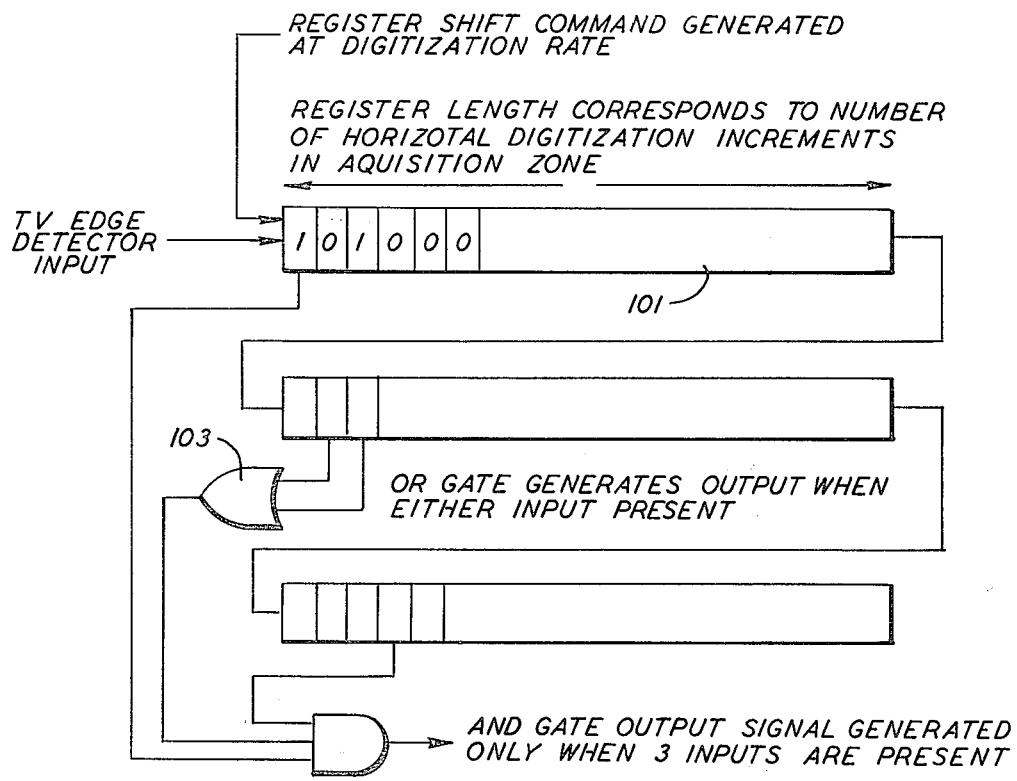
FIG. 9 is a schematic diagram of a digital correlator for target lines having a 1.5:1 vertical to horizontal digitization ratio.

In order to further reduce computer memory storage requirements, further processing of edge position data before storage in memory is possible. FIG. 9 illustrates one possibility. In this scheme, a plurality of 256 bit shift registers 101 are provided and connected such that the output of the first shift register 101 is the input to the first stage of the second shift register and so forth. Each shift register stores one line of data. Outputs are taken from the first stage of the first shift register 101, the second stage of the second shift 101 and the third stage of the third shift register 101 to an AND gate 103. A 10 MHZ output from a clock provides the shift command into the shift registers. The data input is the output of the line position detector 47. Thus, this data is sampled and loaded into the register and continually shifted therethrough. Each shift register 101 will contain one line of data in digital form, "1s" indicating narrow lines or edges and the absence of a "1" indicating the absence of narrow lines or edges. If a diagonal line is present, a diagonal of "1s" should appear as shown on the figure. When this occurs, a diagonal line, which normally only appears in the alignment target geometries has been detected and an output from the AND gate 103 occurs, which output can then be stored in memory. In other words, there will be stored in memory a value corresponding to the horizontal location of the "1" which has been identified as belonging to a diagonal. A slightly different arrangement of the AND gate inputs is required to detect lines or edges of opposite slope.

If the horizontal digitization rate and the vertical spacing between the readout lines in the TV camera do not correspond to the same distance on the TV picture, then some modification of the above scheme is necessary. One possibility is simply to choose a diagonal line having a slope so that the intersection by two adjacent horizontal readout lines corresponds to an integral number of digitization spaces (equal vertical to horizontal digitization ratio). This results in a digitization error of half of the digitization increment. (If the increment is one micron and the line is assumed to lie in the middle of the increment but lies instead at the edge then the error is half the increment.) The digitization error can be reduced by choosing a target line slope and a readout and digitization scheme that does not possess an integral number of digitization spaces between adjacent horizontal TV readout lines. For example, if 45° target lines are used with a digitization scheme having a 1.5 micron space between horizontal lines and a 1.0 micron digitization increment along each line (1.5:1 vertical to horizontal digitization ratio), then the worst error due to digitization will be 0.25 micron averaged over two adjacent lines. With this scheme, the correlator would have to include two possible edge locations on every other line. This is illustrated in FIG. 9.

A schematic of the digitizer and memory buffer is shown in FIG. 10. The vertical and horizontal synchronization pulses generated by the TV camera are used by the memory address logic to determine when the TV signal being read out is contained in either of the two acquisition zones. Typically, each acquisition zone is a rectangular area spanning most of one or the other halves of the split viewing field. Once the TV camera readout beam crosses the edge of an acquisition zone, an edge position counter 105 is incremented at a 10 megahertz rate by a clock 106 and an edge counter 107 is enabled. A signal indicating the presence of a target edge causes the count in the position counter 105 to be held in a latch 108 and the edge counter 107 to be incremented. If the number in the edge counter 107 is less than 16, then the memory address logic 109 causes the number in the latch 108 to be stored in the computer memory 110 at an address which is offset by 16 times the horizontal lines number plus the edge counter number. If the computer memory is sufficiently fast, the line edge position can be stored directly without using a fast buffer memory.

What is claimed is:

1. Apparatus for detecting and aligning first and second diamond shaped targets of a size that can be printed on a microcircuit chip without interfering with the lines thereon, consisting only of lines diagonally disposed with respect to the image transducer which may also be inclined with respect to the chip edges, said targets being of different sizes, said first target on a microcircuit and said second target on a mask to be exposed thereon, comprising:
   (a) a television camera and optical system for viewing said first target on the microcircuit and said second target on the mask to be exposed;
   (b) means having the output of said camera as an input for detecting the edge of each diagonal line on said microcircuit and said mask;
   (c) means for storing coordinates representing the line position location of each detected edge; and
   (d) computing means for:
      (1) calculating from the stored line position locations the centers of the diamond shaped targets.
      (2) calculating the difference between the location of the centers of said two targets.

2. Apparatus according to claim 1 and further including means for aligning the centers of said two targets.

3. An apparatus of claim 1 and further including means for providing dark field illumination to enhance the appearance of target edges.

4. Apparatus according to claim 1 wherein said means for detecting comprises:
   (a) an analog delay line having the video output on the television camera as an input;
   (b) a first differential amplifier having the output of the television camera as its inverting input and the output of the delay line as its non-inverting input,
   (c) a second differential amplifier having the output of the delay line as its non-inverting input and a constant reference voltage source as its inverting input,
   (d) a circuit to "AND" the outputs of the above amplifiers thus giving a positive output voltage when both inputs are positive.

5. Apparatus according to claim 4 wherein said preposessing means comprise a plurality of shift registers, one for each of a plurality of scanning lines, each except the last having a number of stages corresponding to the desired resolution across a TV scan line, said shift registers coupled in series, the output from said TV camera coupled into the first stage of the first shift register; and summing means having as inputs the outputs of first stage of the first shift register, the second stage of the second shift register and the third stage of the third shift register, the output of said summing means coupled to said computing means.

6. Apparatus according to claim 1 and further including preprocessing means connected between said camera and said computer means for detecting diagonal lines.

7. The apparatus according to claim 6 wherein said shift registers comprise digital shift registers, said television camera output is coupled to said first shift register through said edge detector and said summing means comprise an AND gate.

8. An apparatus for detecting position of the centers of two targets, comprising in combination,
   a wafer containing a first target,
   a mask containing a second target relatively movable with respective to said wafer and superimposed over said wafer,
   each of said targets having a center,
   first means for scanning said wafer and mask along a plurality of lines providing an output each time said first means senses an edge of said first or second targets,
   second means connected to said first means providing a digital output indicative of the coordinate of each edge scanned,
   a shift register for each scanned line,
   said shift registers connected in series with the first of said shift registers connected to said first means,
   summing means connected to the first stage of the first shift register, to the second stage of the second shift register and to the third stage of the third shift register,
   memory means storing each of said digital outputs in a position indicative of the coordinate of each edge scanned,
   third means for comparing the $x$ and $y$ values stored for each of said first and second targets providing an output indicative of the relative positions of the centers of said first and second targets,
   motor means connected to said third means for moving said mask and wafer until the output of said third means is indicative of coincidence between the centers of said first and second targets.

9. An apparatus according to claim 8 wherein said first and second targets are diamond shaped.

10. An apparatus for determining the $x$ and $y$ coordinates locations of first and second targets,
   a wafer containing a first target,
   a mask containing a second target,
   each of said targets having a center,
   first means for repeatedly scanning said mask and wafer along a plurality of scan lines providing an output each time said first means senses an edge of said first or second targets,
   second means connected to said first means providing a digital output indicative of the coordinate of each edge scanned,
   said second means comprising,
   a shift register for each scanned line, said shift registers connected in series with the first of said shift registers connected to said first means, summing means connected to the first stage of the first shift register, to the second stage of the second shift register and to the third stage of the third shift register.

11. An apparatus according to claim 10 wherein said first and second targets are diamond shaped.

* * * * *

UNITED STATES PATENT AND TRADEMARK OFFICE
CERTIFICATE OF CORRECTION

PATENT NO. : 4,353,087

DATED : October, 5, 1982

INVENTOR(S) : Daniel G. Berry and David A. Markle

It is certified that error appears in the above-identified patent and that said Letters Patent are hereby corrected as shown below:

Claim 5 should depend from Claim 6 and Claim 7 should depend from Claim 5.

Signed and Sealed this

Fifteenth Day of March 1983

[SEAL]

Attest:

GERALD J. MOSSINGHOFF

Attesting Officer

Commissioner of Patents and Trademarks